(12) United States Patent  (10) Patent No.: US 9,972,521 B2
Nakajima  (45) Date of Patent: May 15, 2018

(54) METHOD FOR MANUFACTURING SEMICONDUCTOR DEVICE TO FACILITATE PEELING OF A SUPPORTING SUBSTRATE BONDED TO A SEMICONDUCTOR WAFER

(71) Applicant: FUJI ELECTRIC CO., LTD., Kawasaki-shi, Kanagawa (JP)

(72) Inventor: Tsunehiro Nakajima, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days. days.

(21) Appl. No.: 14/844,647

(22) Filed: Sep. 3, 2015

(65) Prior Publication Data

US 2015/0380291 A1 Dec. 31, 2015

Related U.S. Application Data

(63) Continuation of application No. PCT/JP2014/062357, filed on May 8, 2014.

(30) Foreign Application Priority Data

May 24, 2013 (JP) .................................. 2013-110433

(51) Int. Cl.
*H01L 21/683* (2006.01)
*H01L 21/304* (2006.01)
(Continued)

(52) U.S. Cl.
CPC ...... *H01L 21/6835* (2013.01); *B23K 26/0063* (2013.01); *B32B 7/06* (2013.01);
(Continued)

(58) Field of Classification Search
CPC .......... B23K 26/0063; B32B 17/10165; B32B 37/1284; B32B 38/0012;
(Continued)

(56) References Cited

U.S. PATENT DOCUMENTS 5,494,849 A * 2/1996 Iyer ..................... H01L 21/3226
148/DIG. 12
7,410,908 B2 * 8/2008 Hara ................. H01L 21/30604
156/345.17
(Continued)

FOREIGN PATENT DOCUMENTS

CN 101183640 A 5/2008
CN 102163559 A 8/2011
(Continued)

OTHER PUBLICATIONS

PCT, "International Search Report for International Application No. PCT/JP2014/062357".
(Continued)

*Primary Examiner* — Thanh T Nguyen
(74) *Attorney, Agent, or Firm* — Manabu Kanesaka

(57) ABSTRACT

A glass substrate is bonded to a front surface of a wafer on which a front surface element structure is formed, with an adhesive layer interposed therebetween. An adhesive layer is formed on the wafer to extend from the front surface of the wafer to a chamfered portion and a side surface of the wafer. The adhesive layer is formed on a first surface of the glass substrate and is not formed on a chamfered portion and a side surface of the glass substrate. After the rear surface of the wafer is ground, a rear surface element structure is formed on the ground rear surface. A laser beam is radiated to the glass substrate and the glass substrate is peeled from the adhesive layer. The adhesive layer is removed and the wafer is cut by dicing. In this way, a chip having a thin semiconductor device formed thereon is completed.

7 Claims, 10 Drawing Sheets

(51) Int. Cl.
  *B23K 26/00* (2014.01)
  *B32B 37/12* (2006.01)
  *B32B 38/00* (2006.01)
  *B32B 7/06* (2006.01)
  *B32B 17/06* (2006.01)
  *B32B 37/18* (2006.01)
  *B32B 38/10* (2006.01)

(52) U.S. Cl.
  CPC .......... *B32B 17/06* (2013.01); *B32B 37/1284* (2013.01); *B32B 38/0012* (2013.01); *H01L 21/304* (2013.01); *B32B 37/18* (2013.01); *B32B 38/10* (2013.01); *B32B 2038/0016* (2013.01); *B32B 2315/08* (2013.01); *B32B 2457/14* (2013.01); *H01L 21/6836* (2013.01); *H01L 2221/6834* (2013.01); *H01L 2221/68327* (2013.01); *H01L 2221/68377* (2013.01); *H01L 2221/68381* (2013.01); *H01L 2221/68386* (2013.01)

(58) Field of Classification Search
  CPC ........ B32B 2038/0016; B32B 2315/08; B32B 2457/14; B32B 37/18; B32B 38/10; H01L 21/304; H01L 21/6835; H01L 21/6836; H01L 2221/68327; H01L 2221/6834; H01L 2221/68377; H01L 2221/6838
  See application file for complete search history.

(56) References Cited

U.S. PATENT DOCUMENTS

| | | | | |
|---|---|---|---|---|
| 7,883,991 | B1* | 2/2011 | Wu | H01L 21/6835 257/686 |
| 2006/0292887 | A1* | 12/2006 | Hara | H01L 21/30604 438/753 |
| 2009/0028671 | A1* | 1/2009 | Jin | H01L 21/67069 414/217 |
| 2011/0151176 | A1* | 6/2011 | Akiyama | H01L 21/6835 428/78 |
| 2011/0267796 | A1* | 11/2011 | Yoshimura | H01L 23/3107 361/820 |
| 2012/0118511 | A1 | 5/2012 | Imai et al. | |
| 2012/0329369 | A1* | 12/2012 | Shimizu | H01L 21/304 451/28 |
| 2013/0213582 | A1 | 8/2013 | Inao et al. | |
| 2013/0220554 | A1 | 8/2013 | Inao et al. | |
| 2013/0230966 | A1* | 9/2013 | Martin | H01L 21/67092 438/458 |
| 2014/0084423 | A1* | 3/2014 | Priewasser | H01L 21/78 257/619 |
| 2014/0287567 | A1* | 9/2014 | Takano | H01L 21/76251 438/459 |
| 2015/0348817 | A1* | 12/2015 | Bodner | H01L 21/6835 156/60 |

FOREIGN PATENT DOCUMENTS

| | | |
|---|---|---|
| JP | S61-110435 A | 5/1986 |
| JP | H02-069938 A | 3/1990 |
| JP | 2006-229076 A | 8/2006 |
| JP | 2010-062269 A | 3/2010 |
| JP | 2011-216763 A | 10/2011 |
| JP | 2012-109519 A | 6/2012 |
| JP | 2012-109538 A | 6/2012 |
| JP | 2012-124467 A | 6/2012 |
| JP | 2012-129324 A | 7/2012 |

OTHER PUBLICATIONS

China Patent Office, "Office Action for Chinese Patent Application No. 201480012112.7," dated Feb. 4, 2017.

* cited by examiner

Prior Art

Prior Art

Prior Art

… (1)

METHOD FOR MANUFACTURING SEMICONDUCTOR DEVICE TO FACILITATE PEELING OF A SUPPORTING SUBSTRATE BONDED TO A SEMICONDUCTOR WAFER

RELATED APPLICATIONS

The present application is a Continuation Application of PCT International Application No. PCT/JP2014/062357 filed May 8, 2014, and claiming priority from Japanese Application No. 2013-110433 filed May 24, 2013, the disclosure of which is incorporated herein.

TECHNICAL FIELD

The present invention relates to a method for manufacturing a semiconductor device.

BACKGROUND ART

A thin semiconductor device which has a smaller thickness than the existing semiconductor device has been developed in order to improve the performance of a semiconductor device made of, for example, silicon (Si), silicon carbide (SiC), or gallium nitride (GaN). When the thin semiconductor device is manufactured, for example, a front surface element structure and a front surface electrode are formed on the front surface side of a wafer, the rear surface of the wafer is ground to a desired thickness (the wafer is thinned), and a rear surface element structure is formed on the ground rear surface of the wafer.

In recent years, as a technique for reducing the thickness of the wafer, the following processes have been known: a TAIKO (registered trademark) process which leaves an outer circumferential portion of the wafer as a reinforcing portion (rib portion) and mechanically grinds only a central portion of the wafer to reduce the thickness of the wafer; and a wafer support system (WSS) process that reinforces a wafer with a supporting substrate and reduces the thickness of the entire wafer. In the TAIKO process, the outer circumferential portion of the wafer remains with the original thickness, without being ground. Therefore, mechanical strength is ensured and the breaking or warping of the wafer is reduced. However, the TAIKO process has a limitation in manufacturing an ultrathin device with a thickness of, for example, 50 µm or less.

As a method for solving the above-mentioned problems, in recent years, a technique for forming a thin device using the WSS process has been developed. In the WSS process, a supporting substrate is bonded to a wafer by an adhesive to ensure the mechanical strength of the wafer. Therefore, it is possible to reduce the thickness of the wafer. The material forming the adhesive is determined by resistance to a manufacturing process or a method for peeling the supporting substrate from the wafer. In general, a method for breaking the chemical bond between the supporting substrate and the adhesive using laser irradiation is used in order to peel the supporting substrate from the wafer. In addition, there is a method which dissolves the adhesive with a solvent or softens the adhesive with heat to reduce the adhesion between the adhesive and the supporting substrate.

Next, a method for manufacturing a thin device using the WSS process according to the related art will be described. FIGS. 17 to 21 are cross-sectional views illustrating the state of a semiconductor device according to the related art during manufacture. First, front-surface-side processing is performed on a wafer 101 to form a front surface element structure (not illustrated) on the front surface side of the wafer 101. Then, an adhesive is applied onto the entire front surface of the wafer 101 by a coater and is then cured to form an adhesive layer 102. Then, a glass substrate 103 is bonded to the front surface of the wafer 101 on which the adhesive layer 102 is formed. This state is illustrated in FIG. 17. Then, the wafer 101 is turned so that the rear surface of the wafer 101 is up. Then, the rear surface of the wafer 101 is ground to reduce the thickness of the wafer 101.

Then, rear-surface-side processing is performed on the wafer 101 to form a rear surface element structure (not illustrated) on the rear surface of the wafer 101. This state is illustrated in FIG. 18. Then, the wafer 101 is turned so that the rear surface of the wafer 101 is down and is then bonded to a dicing tape 112 fixed by a dicing frame 111 (FIG. 19). Then, a laser beam 113 is radiated to the glass substrate 103 to break the chemical bond between the glass substrate 103 and the adhesive layer 102 (FIG. 20). Then, the glass substrate 103 is peeled from the front surface of the wafer 101 and the adhesive layer 102 is removed by, for example, a solvent. Then, the wafer 101 is cut into individual chips 104 by a dicing blade 114. In this way, the chip 104 having a thin semiconductor device formed thereon is completed (FIG. 21).

As a method for peeling the supporting substrate bonded to the wafer, the following method has been proposed: a separation method which separates a supported substrate from a support in a laminate including a light-transmissive support, the supported substrate which is supported by the support, an adhesive layer provided on a surface of the supported substrate which is supported by the support, and a separation layer which is provided between the support and the supported substrate and is made of fluorocarbon. In the method, light is radiated to the separation layer through the support to change the properties of the separation layer (for example, see the following Patent Document 1).

As another method, the following method has been proposed: a separation method which separates a supported substrate from a support in a laminate including a light-transmissive support, the supported substrate which is supported by the support, an adhesive layer provided on a surface of the supported substrate which is supported by the support, and a separation layer which is provided between the support and the supported substrate and is made of an inorganic material. In the method, light is radiated to the separation layer through the support to change the properties of the separation layer (for example, see the following Patent Document 2).

As still another method, the following method has been proposed: a laminate separation method which separates a support from a substrate in a laminate including an infrared-transmissive support, a supported substrate which is supported by the support, an adhesive layer which bonds the supported substrate and the support, and a separation layer that is provided on a surface of the support, to which the supported substrate is bonded, and is made of a compound having an infrared absorbing structure. In the method, infrared rays are radiated to the separation layer through the support to change the properties of the compound (for example, see the following Patent Document 3).

CITATION LIST

Patent Document

Patent Document 1: JP 2012-109519 A
Patent Document 2: JP 2012-109538 A
Patent Document 3: JP 2012-124467 A

DISCLOSURE OF THE INVENTION

Problem to be Solved by the Invention

However, the upper and lower ends (corners: hereinafter, referred to as a chamfered portion) 103b of the side surface 103a of the glass substrate 103 used in the WSS process are chamfered such that chipping does not occur at the outer circumferential end of the glass substrate 103. Therefore, when the laser beam 113 is radiated in order to peel the glass substrate 103 bonded to the wafer 101 as illustrated in FIG. 20, a laser beam 113a which is incident on the chamfered portion 103b is refracted according to the shape of the chamfered portion 103b, for example, the angle of a C-plane (C: chamfer) or the curvature radius of an R-plane (R: radius). In addition, for example, when chipping occurs in the chamfered portion 103b, the laser beam 113b is scattered or reflected from the chamfered portion.

As such, when the laser beam 113b which is incident on the chamfered portion 103b is refracted, scattered, and reflected, the laser beam 113 is not sufficiently radiated to the interface between the glass substrate 103 and the adhesive layer 102 at the outer circumferential end of the glass substrate 103. Therefore, when the adhesive layer 102 is formed so as to extend from a portion interposed between the wafer 101 and the glass substrate 103 to the chamfered portion 103b or the side surface 103a of the glass substrate 103, the laser beam 113 is not radiated to a portion (represented by an arrow 102a in FIG. 20) of the adhesive layer 102 which covers the chamfered portion 103b. As a result, it is difficult or impossible to peel the glass substrate 103 from the wafer 101.

The upper and lower ends (corners: hereinafter, referred to as a chamfered portion) of the side surface of the wafer 101 are chamfered in order to prevent the occurrence of chipping at the outer circumferential end of the wafer 101. Therefore, when the wafer 101 is thinned, the outer circumferential end of the wafer 101 has a knife edge shape. FIG. 16 is a cross-sectional view illustrating the wafer after the thinning process is performed as illustrated in FIG. 18. As illustrated in FIG. 16, since the entire chamfered portion 101b of the wafer 101 is not covered by the adhesive layer 102, a pointed portion (hereinafter, referred to as a pointed portion at the outer circumferential end of the wafer 101) 101e formed by the chamfered portion 101b and the ground rear surface 101d is exposed after the wafer 101 is thinned. Therefore, there is a concern that chipping 101f or breaking will occur in the pointed portion 101e at the outer circumferential end of the wafer 101.

In order to solve the above-mentioned problems of the related art, an object of the invention is to provide a method for manufacturing a semiconductor device which can facilitate the peeling of a supporting substrate bonded to a wafer. In addition, in order to solve the above-mentioned problems of the related art, another object of the invention is to provide a method for manufacturing a semiconductor device which can prevent the chipping or breaking of a wafer when each process is performed on a wafer bonded to a supporting substrate.

Means for Solving Problem

In order to solve the above-mentioned problems and achieve the objects of the invention, a method for manufacturing a semiconductor device according to an aspect of the invention has the following characteristics. First, an adhesive layer forming step of forming an adhesive layer on a first main surface of a semiconductor wafer such that an outer circumferential portion protrudes from a central portion is performed. Then, a bonding step of bonding a supporting substrate to the first main surface of the semiconductor wafer, with the adhesive layer interposed therebetween, such that a side surface of the semiconductor wafer is covered by the adhesive layer, is performed.

In the method for manufacturing a semiconductor device according to the above-mentioned aspect of the invention, in the supporting substrate, corners of a side surface and a surface which faces the first main surface of the semiconductor wafer may be chamfered. In the bonding step, a portion of the supporting substrate which is arranged inside the chamfered portion may be covered by the adhesive layer.

In the method for manufacturing a semiconductor device according to the above-mentioned aspect of the invention, corners of the first main surface and the side surface of the semiconductor wafer may be chamfered. A thinning step of grinding a second main surface of the semiconductor wafer to the chamfered portion of the semiconductor wafer to reduce the thickness of the semiconductor wafer, with the semiconductor wafer bonded to the supporting substrate, may be further performed. In the bonding step, the adhesive layer which covers the side surface of the semiconductor wafer may be spread so as to remain on the entire surface of the chamfered portion of the semiconductor wafer after the thinning step.

In the method for manufacturing a semiconductor device according to the above-mentioned aspect of the invention, in the supporting substrate, corners of a side surface and a surface which faces the first main surface of the semiconductor wafer may be chamfered. A removal step of removing a portion of the adhesive layer which covers the supporting substrate from the chamfered portion to an outer portion may be further performed after the bonding step.

In the method for manufacturing a semiconductor device according to the above-mentioned aspect of the invention, corners of the first main surface and the side surface of the semiconductor wafer may be chamfered. A thinning step of grinding a second main surface of the semiconductor wafer to the chamfered portion of the semiconductor wafer to reduce the thickness of the semiconductor wafer, with the semiconductor wafer bonded to the supporting substrate, may be further performed. In the removal step, the adhesive layer may be removed such that a portion of the adhesive layer which covers the semiconductor wafer thinned in the thinning step from the first main surface to the chamfered portion remains.

The method for manufacturing a semiconductor device according to the above-mentioned aspect of the invention may further include an element structure forming step of forming an element structure on the second main surface of the semiconductor wafer thinned in the thinning step before the removal step. In the removal step, an adhesive area between the supporting substrate and the adhesive layer may be reduced such that the position of the outer circumference of the adhesive layer is located outside the position of the outer circumference of the semiconductor wafer.

According to the above-mentioned aspect of the invention, when a laser beam is radiated in order to peel the supporting substrate from the adhesive layer, the adhesive layer is not formed on a portion of the supporting substrate other than the first surface. Therefore, a laser beam can be sufficiently radiated from the second surface of the supporting substrate to the outer circumferential end of the adhesive layer, without being radiated to the chamfered portion of the supporting substrate. As a result, it is possible to break the bond between the adhesive layer and the supporting substrate.

In addition, according to the above-mentioned aspect of the invention, when the semiconductor wafer and the supporting substrate are bonded to each other by the adhesive layer, the adhesive layer is formed from the first main surface to the side surface of the semiconductor wafer. Therefore, a pointed portion which is generated at the outer circumferential end of the semiconductor wafer after the semiconductor wafer is thinned is protected by the adhesive layer. As a result, in the subsequent process, it is possible to prevent stress from being applied to the pointed portion at the outer circumferential end of the semiconductor wafer.

Effect of the Invention

According to the method for manufacturing the semiconductor device of the invention, it is possible to easily peel the supporting substrate bonded to the wafer. In addition, according to the method for manufacturing the semiconductor device of the invention, it is possible to prevent the chipping or breaking of the wafer when each process is performed on the wafer bonded to the supporting substrate.

MODE(S) FOR CARRYING OUT THE INVENTION

Figure 1:
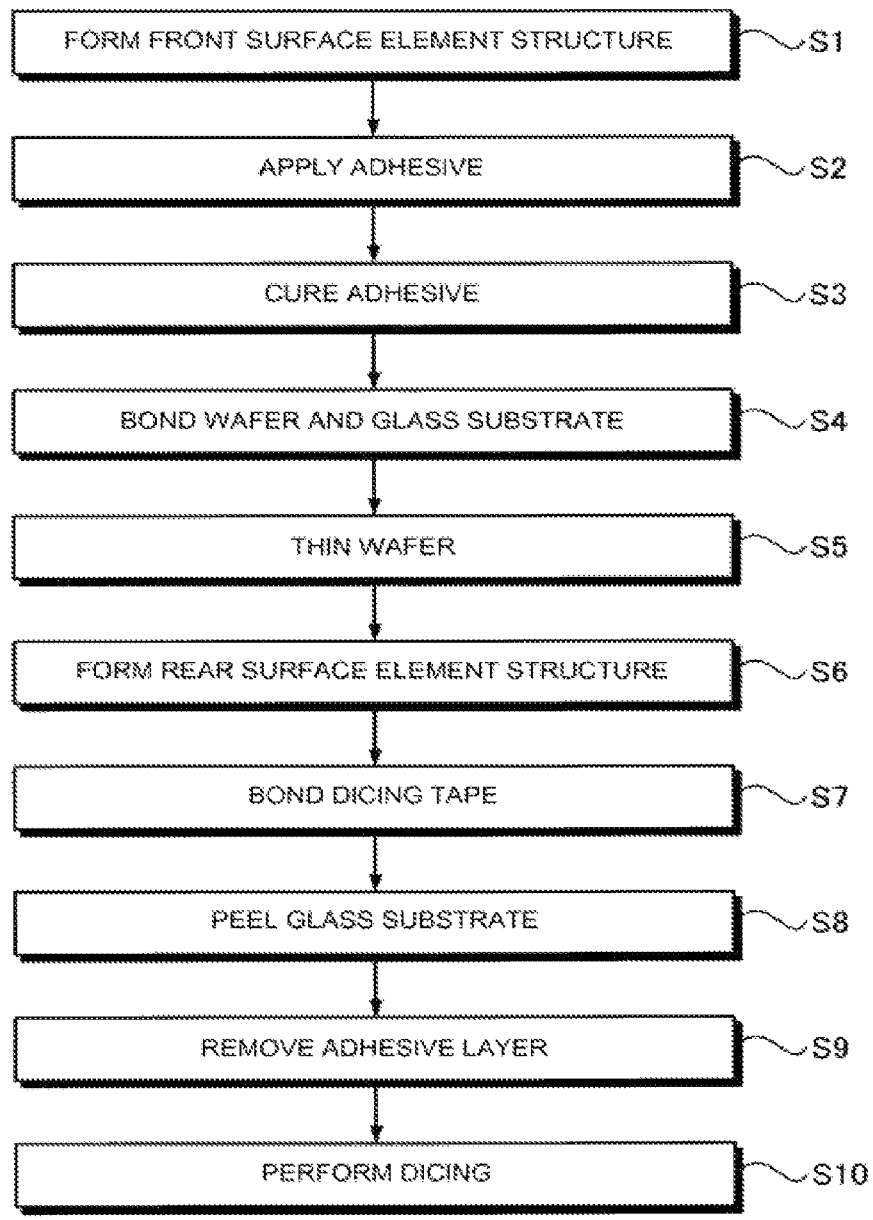
FIG. 1 is a flowchart illustrating the outline of a method for manufacturing a semiconductor device according to Embodiment 1.

Hereinafter, preferred embodiments of a method for manufacturing a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

Embodiment 1

A method for manufacturing a semiconductor device according to Embodiment 1 will be described. FIG. 1 is a flowchart illustrating the outline of the method for manufacturing a semiconductor device according to Embodiment 1. FIGS. 2 to 5 are cross-sectional views illustrating states during manufacture in the flowchart illustrated in FIG. 1. First, processing is performed on a front surface of a general wafer 1 to form a front surface element structure (not illustrated) on a front surface (first main surface) 1c of the wafer 1 (Step S1). Then, an adhesive 2 is applied onto the entire front surface 1c of the wafer 1 by a coater (Step S2). In Step S2, for example, a spinning method which rotates the wafer 1 fixed to a stage at a high speed to spread the adhesive 2 applied onto the front surface 1c of the wafer 1 using centrifugal force is used.

The upper and lower ends (corners: hereinafter, referred to as chamfered portions) 1b of a side surface 1a of the wafer 1 are chamfered such that, for example, no chipping occurs at the outer circumferential end of the wafer 1. The chamfered portion 1b of the wafer 1 may be, for example, a C-plane which is chamfered at an angle of 45°, a plane which is chamfered at an angle other than 45°, or an R-plane with curvature. Therefore, the outer circumferential end of the wafer 1 has, for example, a tapered shape in which the thickness of the outer circumferential end is less than that of a central portion or an arc shape with curvature. Hereinafter, an example in which the outer circumferential end of the wafer 1 has a tapered shape will be described. The side surface 1a of the wafer 1 is a flat surface that is substantially perpendicular to the front surface 1c of the wafer 1. The outer circumferential end of the wafer 1 is a tapered-shape portion that is formed by the side surface 1a and the chamfered portion 1b of the wafer 1.

It is preferable that the adhesive 2 has appropriate viscosity and drops onto the wafer 1 in a liquid state. Specifically, for example, a polyimide-based adhesive or an acryl-based adhesive may be used as the adhesive 2. An uneven portion with a size of about 10 µm to 15 µm is generated in the front surface 1c due to the front surface element structure formed on the front surface 1c of the wafer 1. The adhesive 2 drops in a liquid state in order to prevent an uneven portion from being generated in the surface of the adhesive 2 due to the uneven portion of the front surface 1c of the wafer 1. When the adhesive 2 is applied onto the entire front surface 1c of the wafer 1 while the wafer 1 is being rotated at a high speed, the thickness of the adhesive 2 in the vicinity of the central portion of the wafer 1 may be, for example, about 20 µm.

Figure 2:
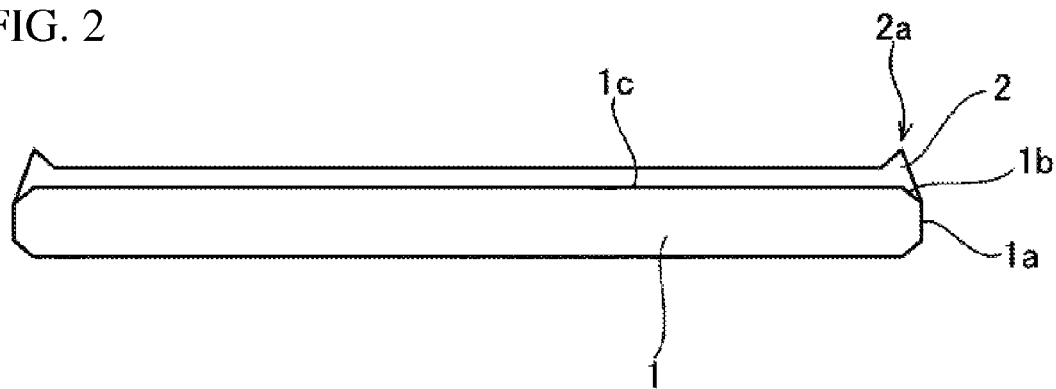
FIG. 2 is a cross-sectional view illustrating a state during manufacture in the flowchart illustrated in FIG. 1.

Since the adhesive 2 has viscosity, an outer circumferential end 2a of the adhesive 2 protrudes from a portion at the center of the wafer 1 due to centrifugal force generated by the high-speed rotation of the wafer 1. In this state, the adhesive 2 is cured to form an adhesive layer (hereinafter, referred to as an adhesive layer 2) on the entire front surface 1c of the wafer 1 (Step S3). In this way, the adhesive layer 2 is formed such that the outer circumferential portion protrudes from the central portion. In this case, the adhesive layer 2 may be formed so as to extend to the chamfered portion 1b or the side surface 1a of the wafer 1. This state is illustrated in FIG. 2.

Figure 3:
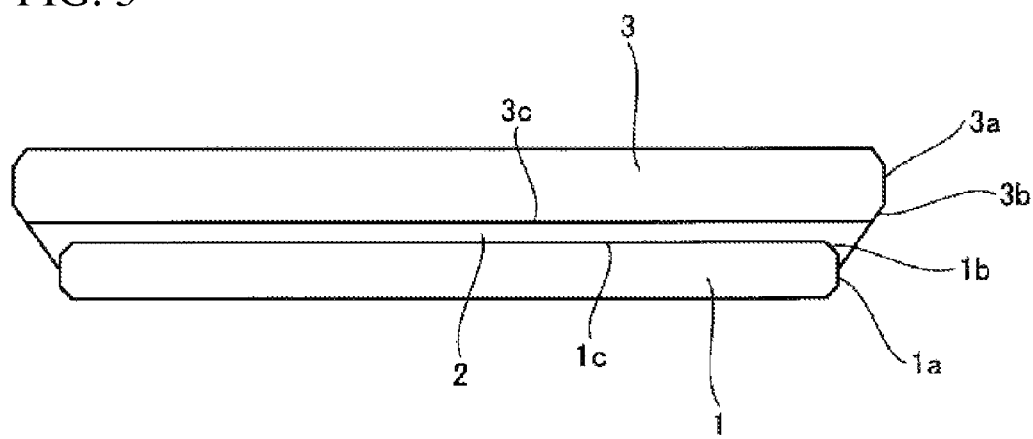
FIG. 3 is a cross-sectional view illustrating a state during manufacture in the flowchart illustrated in FIG. 1.

Then, a glass substrate 3 is bonded to the front surface 1c of the wafer 1 on which the adhesive layer 2 is formed (Step S4). That is, the glass substrate 3 reinforces the wafer 1 to improve the mechanical strength of the wafer 1 (WSS process). Specifically, after the glass substrate 3 is placed on the front surface 1c of the wafer 1 on which the adhesive layer 2 is formed, pressure is applied to the wafer 1 and the glass substrate 3 in a direction in which the adhesive layer 2 is pressed, while the laminate is being heated in a vacuum atmosphere. The adhesive 2 between the wafer 1 and the glass substrate 3 is softened by the heat and the adhesive layer 2 is deformed by the pressure. The protruding portion in the outer circumference of the adhesive layer 2 is extruded to the outside and covers the side surface 1a of the wafer 1. In this way, the adhesive layer 2 covers the wafer 1 from the front surface 1c to the side surface 1a. In addition, a portion of the glass substrate 3 inside the chamfered portion 3b, which will be described below, is covered by the adhesive layer 2. In this state, the adhesive 2 is cured again and the wafer 1 and the glass substrate 3 are bonded to each other. This state is illustrated in FIG. 3.

The upper and lower ends (corners: hereinafter, referred to as chamfered portions) 3b of the side surface 3a are chamfered such that no chipping occurs at the outer circumferential end of the glass substrate 3. The chamfered portion 3b of the glass substrate 3 may be, for example, a C-plane which is chamfered at an angle of 45°, a plane which is chamfered at an angle other than 45°, or an R-plane with curvature. Therefore, the outer circumferential end of the glass substrate 3 has, for example, a tapered shape in which the thickness of the outer circumferential end is less than that of a central portion or an arc shape with curvature. Hereinafter, an example in which the outer circumferential end of the glass substrate 3 has a tapered shape will be described. The side surface 3a of the glass substrate 3 is a flat surface that is substantially perpendicular to a flat surface (hereinafter, referred to as a first surface) 3c of the glass substrate 3 which faces the wafer 1. The outer circumferential end of the glass substrate 3 is a tapered-shape portion that is formed by the side surface 3a and the chamfered portion 3b of the glass substrate 3.

A substrate which has transmissivity capable of transmitting a laser beam generated by laser irradiation, which will be described below, and is not damaged by the laser irradiation is used as the glass substrate 3. Specifically, the glass substrate 3 may have a transmissivity of about 40% with respect to the laser beam. In addition, the glass substrate 3 may be made of boron-based glass. The diameter of the glass substrate 3 is substantially equal to the diameter of the wafer 1 and preferably has a radius that is, for example, about 0.25 mm greater than the radius of the wafer 1. The reason why the diameter of the glass substrate 3 is substantially equal to the diameter of the wafer 1 is that a wafer process can be performed by the existing facilities and the existing wafer process. The reason why the radius of the glass substrate 3 is larger than the radius of the wafer 1 is that it is easy to form the shape of the end of the adhesive layer 2, which will be described below.

The adhesive layer 2 covers the wafer 1 from the front surface 1c to the chamfered portion 1b and the side surface 1a of the wafer 1. In addition, the adhesive layer 2 is formed on the first surface 3c of the glass substrate 3 and is not formed on the chamfered portion 3b and the side surface 3a of the glass substrate 3. That is, the outer circumferential end 2b of the adhesive layer 2 is located on the side surface 1a of the wafer 1 and is located on the first surface 3c of the glass substrate 3. Specifically, the outer circumferential end 2b of the adhesive layer 2 has a tapered shape which is gradually widened from the side surface 1a of the wafer 1 to the first surface 3c of the glass substrate 3.

The position of the outer circumferential end 2b of the adhesive layer 2 is determined by the amount of adhesive layer 2 which wraps the side surface 1a of the wafer 1 when the wafer 1 and the glass substrate 3 are bonded to each other in Step S4. Therefore, it is preferable that the adhesive layer 2 which covers the side surface 1a of the wafer 1 be spread so as to remain on the entire surface of the chamfered portion 1b of the wafer 1 after a thinning process, which will be described below, in Step S4. In Step S4, since the wafer 1 and the glass substrate 3 are bonded to each other in a vacuum atmosphere, it is possible to prevent air bubbles from remaining in the adhesive layer 2.

In Step S4, the amount of adhesive layer 2 which wraps the outer circumferential end of the wafer 1 may be determined by various factors, such as viscosity before the adhesive layer 2 is cured (adhesive), the number of rotations when the adhesive is applied in Step S2 (that is, the thickness of the outer circumferential end 2a of the adhesive), conditions when the adhesive is cured in Step S3 (that is, the degree of dryness of the adhesive layer 2), and the pressure applied to bond the wafer 1 and the glass substrate 3 in Step S4. For example, Step S2 may be performed in a closed space such that the adhesive applied onto the wafer 1 is not exposed to the air, in order to adjust the degree of dryness of the adhesive layer 2. In addition, it is preferable that the adhesive layer 2 has heat resistance to a high-temperature process in rear-surface-side processing which will be described below.

Figure 4:
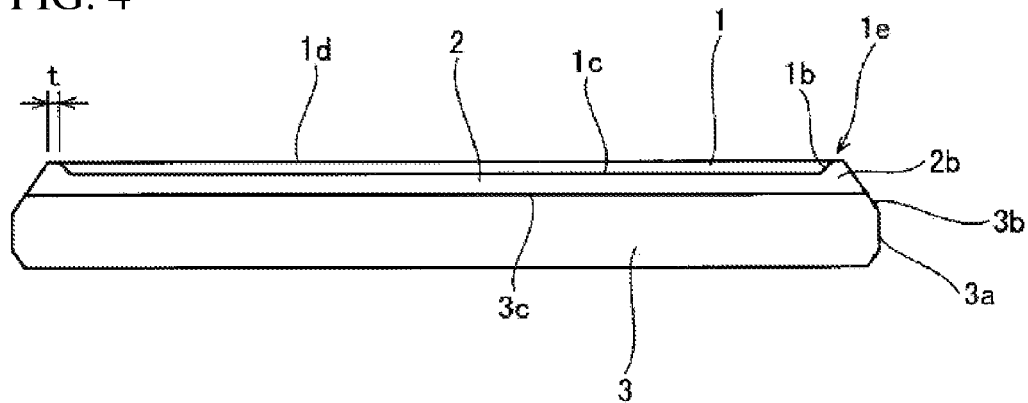
FIG. 4 is a cross-sectional view illustrating a state during manufacture in the flowchart illustrated in FIG. 1.

Then, the wafer 1 is turned so that the rear surface of the wafer 1 is up. Then, the rear surface of the wafer 1 is ground by, for example, back grinding such that the thickness of the wafer 1 is reduced to, for example, 50 µm (Step S5). Then, general rear-surface-side processing is performed on the wafer 1 to form a rear surface element structure (not illustrated) on a rear surface 1d of the wafer 1 (Step S6). The wafer 1 may be thinned by, for example, a chemical mechanical polishing (CMP) method using a grinder or a dissolution method using etching. When the wafer 1 is produced using, for example, silicon carbide (SiC) as a semiconductor material, the wafer 1 may be thinned by the CMP method since a SiC wafer is not dissolved. This state is illustrated in FIG. 4.

After Step S5, the outer circumferential end of the wafer 1 has a knife edge shape formed by the chamfered portion 1b and the ground rear surface 1d. However, since the outer circumferential end 2b of the adhesive layer 2 extends to the side surface 1a of the wafer 1 in Step S4, the entire chamfered portion 1b of the wafer 1 is covered by the adhesive layer 2 even after the wafer 1 is thinned. Therefore, a pointed portion 1e at the outer circumferential end of the wafer 1 is buried in the adhesive layer 2 and is not exposed to the outside. After the wafer 1 is thinned, the thickness t of the outer circumferential end 2b of the adhesive layer 2 in the pointed portion 1e at the outer circumferential end of the wafer 1 in a direction parallel to the main surface of the wafer 1 may be a sufficient value to maintain the mechanical strength of the point portion 1e at the outer circumferential end of the wafer 1. Preferably, the thickness t may be small enough to easily peel the glass substrate 3 in a process of peeling the glass substrate 3 which will be described below.

Figure 5:
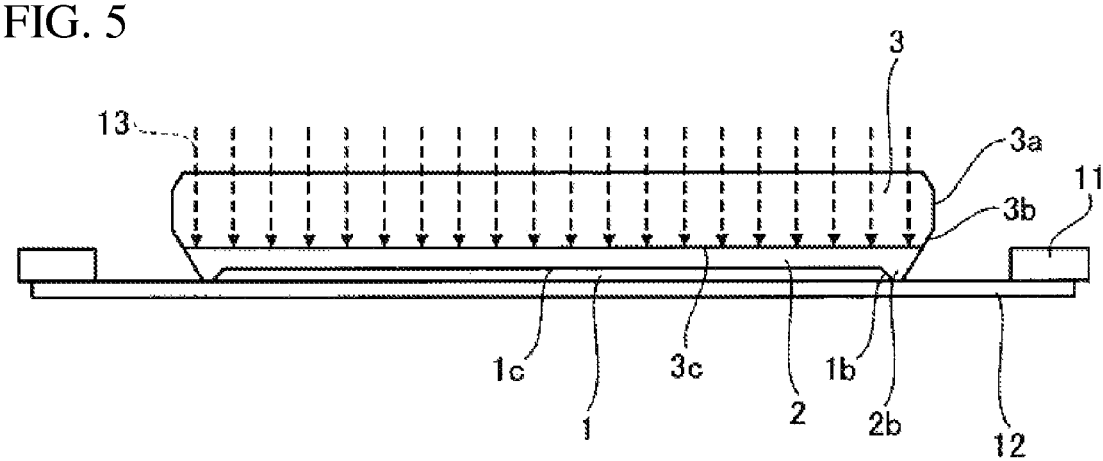
FIG. 5 is a cross-sectional view illustrating a state during manufacture in the flowchart illustrated in FIG. 1.

Then, the wafer 1 is turned so that the rear surface 1d of the wafer 1 is down and is bonded to a dicing tape 12 fixed by a dicing frame 11 (Step S7). Then, a laser beam 13 is radiated to the glass substrate 3 to break the chemical bond between the glass substrate 3 and the adhesive layer 2 and the glass substrate 3 is peeled off from the adhesive layer 2 (Step S8). This state is illustrated in FIG. 5. Since the chamfered portion 3b and the side surface 3a of the glass substrate 3 are not covered by the adhesive layer 2, it is possible to irradiate the entire interface between the glass substrate 3 and the adhesive layer 2 with the laser beam 13 even when the laser beam 13 radiated to the chamfered portion 3b of the glass substrate 3 is refracted, scattered, and reflected during irradiation with the laser beam 13. FIG. 5 illustrates a case in which the laser beam 13 is radiated only to the interface between the glass substrate 3 and the adhesive layer 2. Since the dicing tape 12 which has resistance to irradiation with the laser beam 13 is used, it is possible to radiate the laser beam 13 in a range that is greater than the area of the interface between the glass substrate 3 and the adhesive layer 2.

A laser beam with a wavelength that is transmitted through the glass substrate 3 and is not absorbed by the adhesive layer 2 is used as the laser beam 13. Specifically, for example, a YAG laser beam with a short wavelength may be used as the laser beam 13. Then, the glass substrate 3 is peeled off from the front surface 1c of the wafer 1 and the adhesive layer 2 is removed (Step S9). In Step S9, the seal-shaped adhesive layer 2 may be peeled off from the glass substrate 3 and the adhesive layer 2 may be removed. Alternatively, the adhesive layer 2 may be dissolved by, for example, a solvent and the adhesive layer 2 may be removed. Then, a general dicing process is performed, that is, the wafer 1 is cut by a dicing blade (Step S10). In this way, a chip having a thin semiconductor device formed thereon is completed.

As described above, according to Embodiment 1, during laser irradiation for peeling the adhesive layer from the glass substrate, since the adhesive layer is not formed on the chamfered portion and the side surface of the glass substrate, it is possible to sufficiently radiate the laser beam from the flat surface (second surface) of the glass substrate to the outer circumferential end of the adhesive layer, without radiating the laser beam to the chamfered portion of the glass substrate. Therefore, it is possible to break the bond between the adhesive layer and the glass substrate and thus to easily peel the glass substrate from the adhesive layer.

According to Embodiment 1, when the wafer and the glass substrate are bonded to each other by the adhesive layer, the pointed portion which is generated at the outer circumferential end of the wafer after the wafer is thinned is protected by the adhesive layer that covers the chamfered portion of the wafer since the adhesive layer is formed so as to extend from the front surface to the chamfered portion and the side surface of the wafer. Therefore, in the subsequent process, it is possible to prevent stress from being applied to the point portion at the outer circumferential end of the wafer. As a result, it is possible to prevent the chipping (crack) or breaking of the wafer.

Embodiment 2

Figure 7:
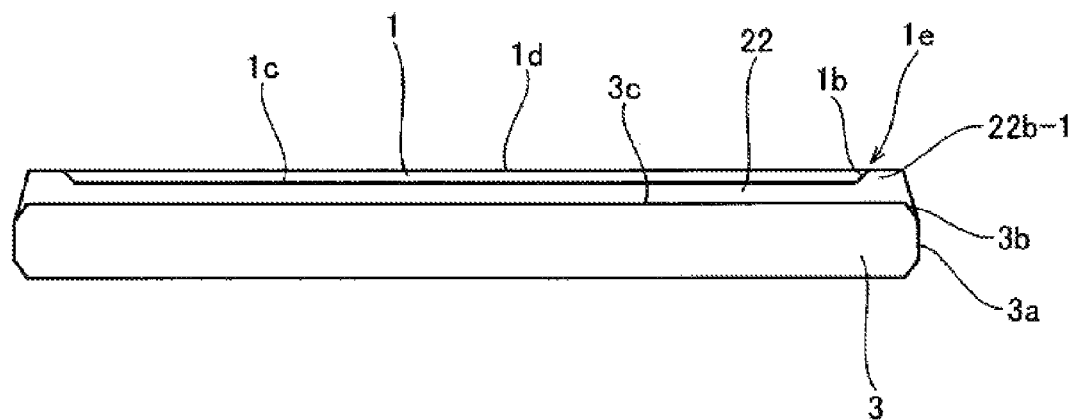
FIG. 7 is a cross-sectional view illustrating a state during manufacture in the flowchart illustrated in FIG. 6.
Figure 8:
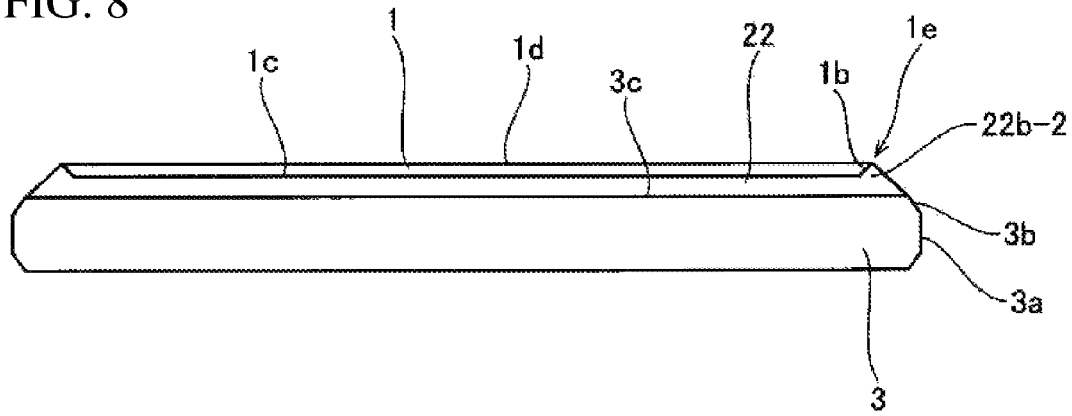
FIG. 8 is a cross-sectional view illustrating a state during manufacture in the flowchart illustrated in FIG. 6.
Figure 6:
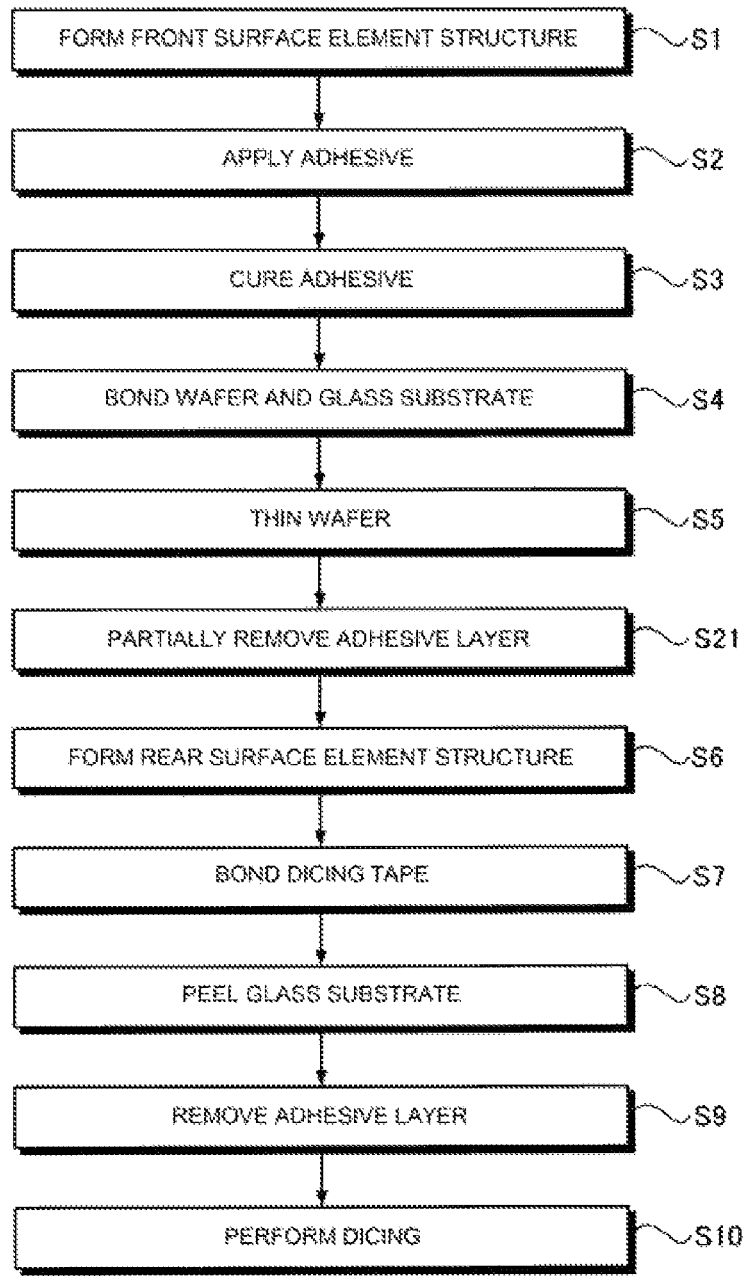
FIG. 6 is a flowchart illustrating the outline of a method for manufacturing a semiconductor device according to Embodiment 2.
Figure 9:
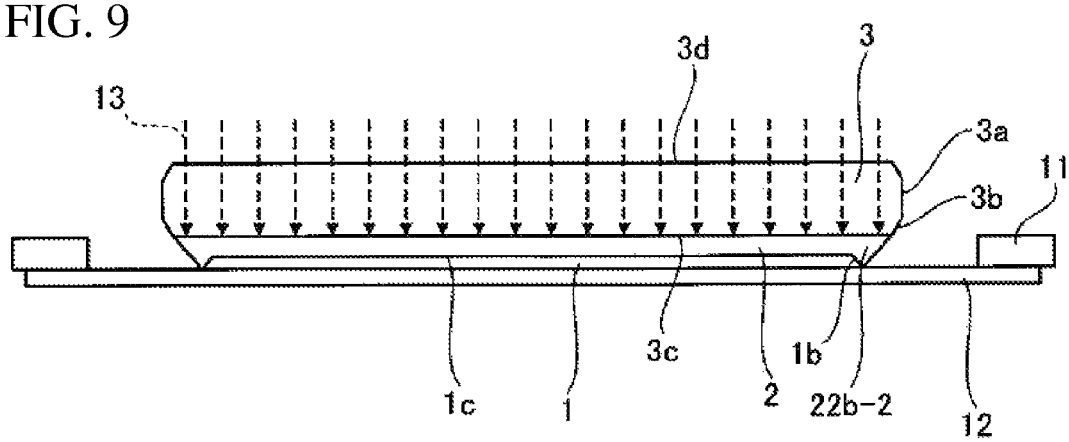
FIG. 9 is a cross-sectional view illustrating a state during manufacture in the flowchart illustrated in FIG. 6.

Next, a method for manufacturing a semiconductor device according to Embodiment 2 will be described. FIG. 6 is a flowchart illustrating the outline of the method for manufacturing the semiconductor device according to Embodiment 2. FIGS. 7 to 9 are cross-sectional views illustrating states during manufacture in the flowchart illustrated in FIG. 6. The method for manufacturing the semiconductor device according to Embodiment 2 differs from the method for manufacturing the semiconductor device according to Embodiment 1 in that a process (Step S21) of removing an extra portion of an adhesive layer 22 is added between Step S5 and Step S6. That is, in Embodiment 2, when a wafer 1 and a glass substrate 3 are bonded to each other and a chamfered portion 3b and a side surface 3a of the glass substrate 3 are covered by a protruding portion in the outer circumference of an adhesive layer 22, the extra portion of the adhesive layer 22 is removed.

Specifically, first, similarly to Embodiment 1, Steps S1 to S5 are performed. Then, a portion of the adhesive layer 22 which covers the chamfered portion 3b and the side surface 3a of the glass substrate 3 is removed (Step S21). Then, similarly to Embodiment 1, Steps S6 to S10 are performed to complete a chip having a thin semiconductor device formed thereon. Specifically, when an outer circumferential end 22b-1 of the adhesive layer 22 extends to the chamfered portion 3b or the side surface 3a of the glass substrate 3 (FIG. 7), the shape of the end of the adhesive layer 22 is appropriately adjusted in Step S21 after the wafer 1 is thinned (Step S5) and before the rear surface of the wafer 1 is processed (Step S6) (FIG. 8).

In Step S21, an extra portion (a portion which covers the chamfered portion 3b and the side surface 3a of the glass substrate 3) at the outer circumferential end 22b-1 of the adhesive layer 22 is removed by a dissolution method using a solvent or an ashing method. In addition, in Step S21, the outer circumferential end of the adhesive layer 22 is recessed inward such that a pointed portion 1e which is generated at the outer circumferential end of the wafer 1 after the wafer 1 is thinned is not exposed. FIG. 7 illustrates a state in which the outer circumferential end 22b-1 of the adhesive layer 22 extends to the chamfered portion 3b and the side surface 3a of the glass substrate 3. FIG. 8 illustrates a state in which a portion of the adhesive layer 22 which covers the chamfered portion 3b and the side surface 3a of the glass substrate 3 is removed.

As illustrated in FIG. 8, the outer circumferential end 22b-2 of the adhesive layer 22 covers the entire chamfered portion 1b of the wafer 1 and does not cover the chamfered portion 3b and the side surface 3a of the glass substrate 3. Therefore, similarly to Embodiment 1, a laser beam 13 can be radiated to the entire interface between the glass substrate 3 and the adhesive layer 22. This state is illustrated in FIG. 9. In FIG. 9, reference numeral 3d indicates a second surface of the glass substrate 3. In Step S5, it is preferable that the wafer 1 be ground, with the side surface 1a of the wafer 1 covered by the adhesive layer 22. The reason is that, when the wafer 1 is ground, stress applied to the outer circumferential end of the wafer 1 is reduced. For example, when Step S21 is performed before Step S5, a portion of the adhesive layer 22 which covers the chamfered portion 1b and the side surface 1a of the wafer 1 is likely to be removed in Step S21 and then Step S5 is likely to be performed. Therefore, it is preferable to perform Step S21 after Step S5.

Figure 10:
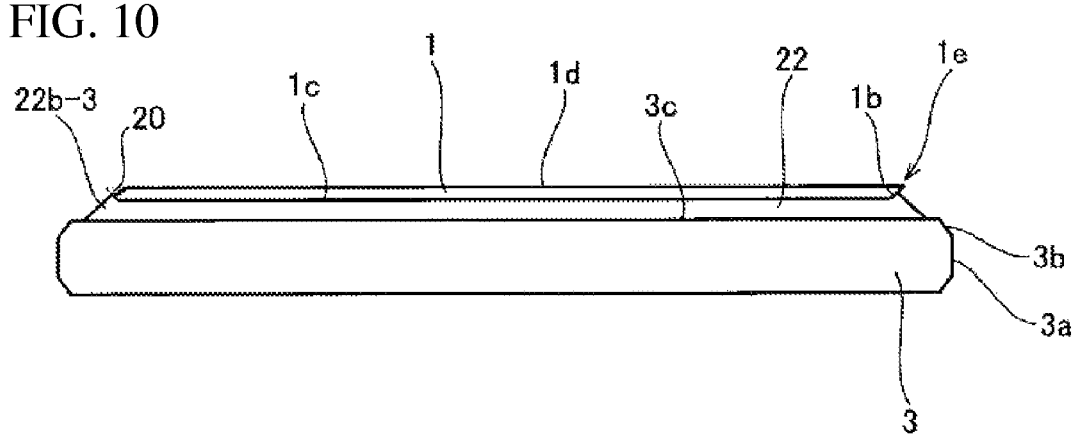
FIG. 10 is a cross-sectional view illustrating the state of a semiconductor device according to Comparative Example 1 during manufacture.

FIG. 10 illustrates an example in which the outer circumferential end 22b-1 of the adhesive layer 22 is excessively removed in Step S21. FIG. 10 is a cross-sectional view illustrating the state of a semiconductor device according to Comparative Example 1 during manufacture. In Step S21, when the outer circumferential end 22b-1 of the adhesive layer 22 is excessively removed, only a part of a chamfered portion 1b of the wafer 1 is covered by an outer circumferential end 22b-3 of an adhesive layer 22 and a pointed portion 1e (a portion represented by reference numeral 20) at the outer circumferential end of a wafer 1 is exposed, as illustrated in FIG. 10. Therefore, in the subsequent process, chipping or breaking occurs at the pointed portion 1e at the outer circumferential end of the wafer 1, which is not preferable.

As described above, according to Embodiment 2, the portion of the adhesive layer which covers the chamfered portion and the side surface of the glass substrate is removed after the wafer is thinned and before the rear surface of the wafer is processed. Therefore, it is possible to obtain the same effect as that in Embodiment 1.

Embodiment 3

Figure 12:
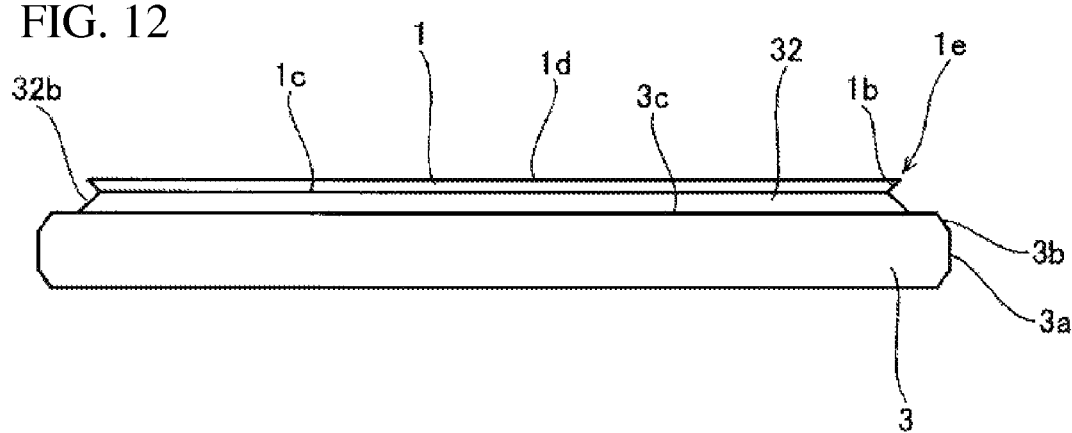
FIG. 12 is a cross-sectional view illustrating a state during manufacture in the flowchart illustrated in FIG. 11.
Figure 11:
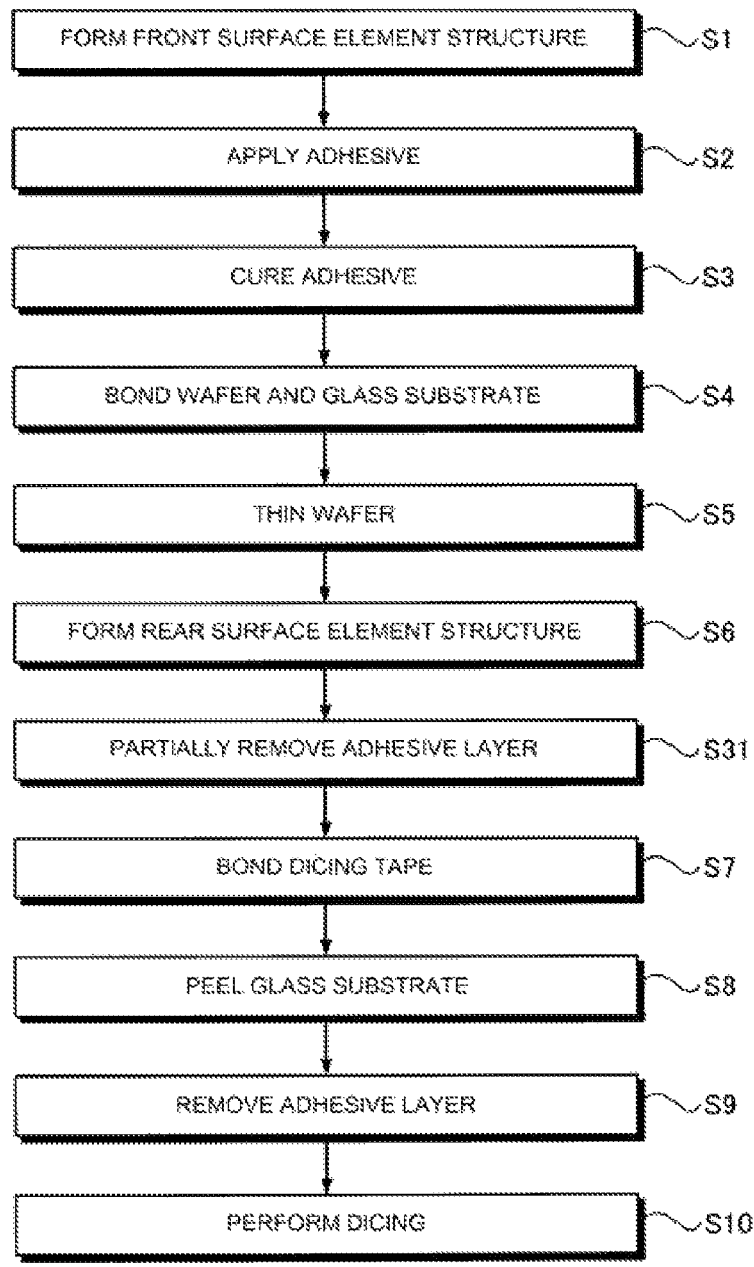
FIG. 11 is a flowchart illustrating the outline of a method for manufacturing a semiconductor device according to Embodiment 3.
Figure 13:
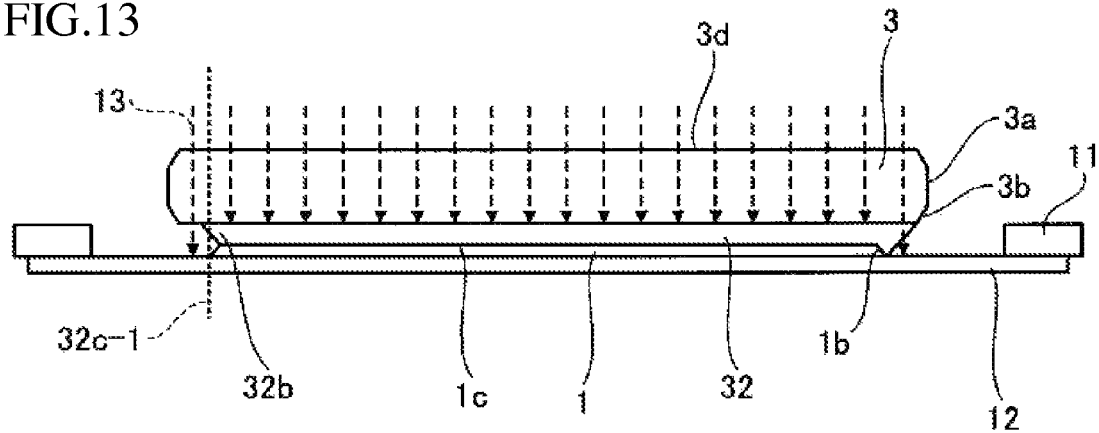
FIG. 13 is a cross-sectional view illustrating a state during manufacture in the flowchart illustrated in FIG. 11.

Next, a method for manufacturing a semiconductor device according to Embodiment 3 will be described. FIG. 11 is a flowchart illustrating the outline of the method for manufacturing the semiconductor device according to Embodiment 3. FIGS. 12 and 13 are cross-sectional views illustrating a state during manufacture in the flowchart illustrated in FIG. 11. The method for manufacturing the semiconductor device according to Embodiment 3 differs from the method for manufacturing the semiconductor device according to Embodiment 1 in that a process (Step S31) of removing an extra portion of an adhesive layer 32 is added between Step S6 and Step S7. That is, in Embodiment 3, similarly to Embodiment 2, when a wafer 1 and a glass substrate 3 are bonded to each other and a chamfered portion 3b and a side surface 3a of the glass substrate 3 are covered by a protruding portion in the outer circumference of an adhesive layer 32, the extra portion of the adhesive layer 32 is removed.

Specifically, first, similarly to Embodiment 1, Steps S1 to S6 are performed. Then, in the adhesive layer 32, a portion which covers a chamfered portion 1b of the wafer and a portion which covers the chamfered portion 3b and the side surface 3a of the glass substrate 3 are removed (Step S31). Then, similarly to Embodiment 1, Steps S6 to S10 are performed to complete a chip having a thin semiconductor device formed thereon. In Step 31, a method for selectively removing the adhesive layer 32 is the same as that in Embodiment 2. Then, similarly to Embodiment 1, Steps S7 to S10 are performed. In this way, a chip having a thin semiconductor device formed thereon is completed. Specifically, when an outer circumferential end 32b of the adhesive layer 32 extends to the chamfered portion 3b or the side surface 3a of the glass substrate 3 (FIG. 7), the shape of the end of the adhesive layer 32 is appropriately adjusted in Step S31 after the rear surface of the wafer 1 is processed (Step S6) and before the glass substrate 3 is peeled off (Step S8) (FIG. 12).

In Step S31, an extra portion (a portion which covers the chamfered portion 3b and the side surface 3a of the glass substrate 3) at the outer circumferential end 32b of the adhesive layer 32 is removed such that an outer circumferential position 32c-1 of the outer circumferential end 32b of the adhesive layer 32 is located inside a pointed portion 1e which is generated at the outer circumferential end of the wafer 1 after the wafer 1 is thinned. When the outer circumferential position 32c-1 of the outer circumferential end 32b of the adhesive layer 32 is located in the above-mentioned range, an outer circumferential portion of a front surface 1c of the wafer 1 is slightly exposed. FIG. 12 illustrates a state in which the portion of the adhesive layer 32 which covers the chamfered portion 3b and the side surface 3a of the glass substrate 3 is removed.

As illustrated in FIG. 12, an adhesive area between the glass substrate 3 and the adhesive layer 32 is reduced. Therefore, similarly to embodiment 1, it is possible to radiate a laser beam 13 to the entire interface between the glass substrate 3 and the adhesive layer 32. In addition, since the outer circumferential position 32c-1 of the outer circumferential end 32b of the adhesive layer 32 is located inside the pointed portion 1e at the outer circumferential end of the wafer 1, it is possible to prevent the laser beam 13 from being radiated to the wafer 1 in Step S8. This state is illustrated in FIG. 13.

Figure 14:
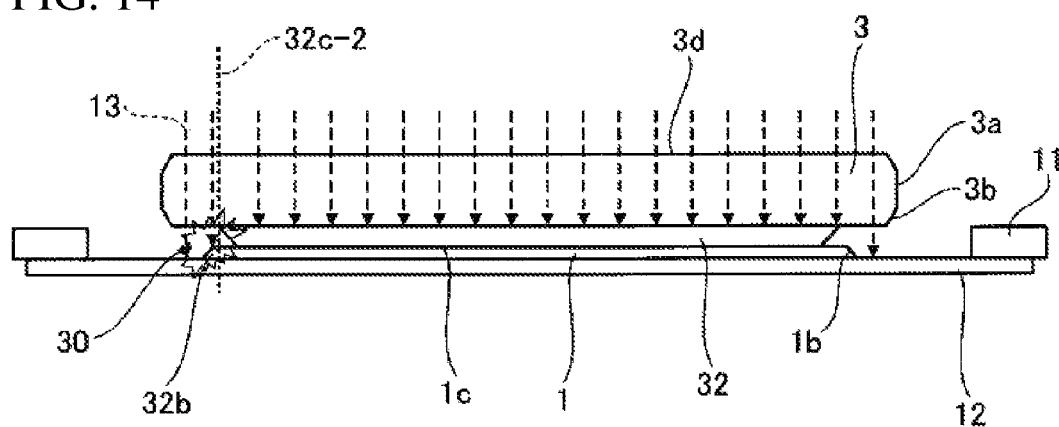
FIG. 14 is a cross-sectional view illustrating the state of a semiconductor device according to Comparative Example 2 during manufacture.
Figure 16:
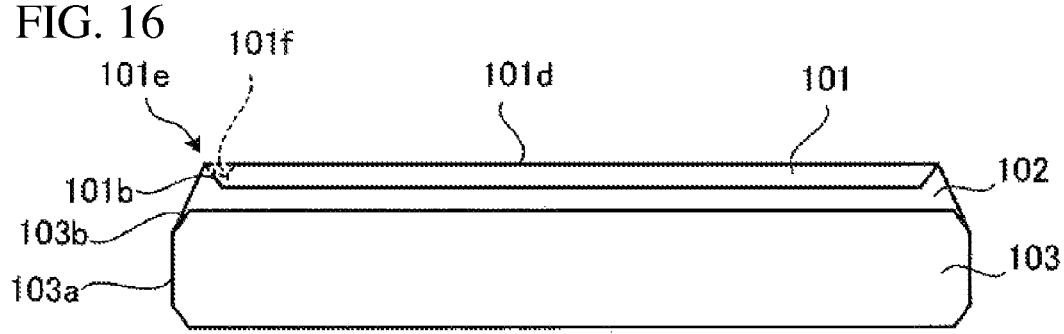
FIG. 16 is a cross-sectional view illustrating a wafer after a thinning process illustrated in FIG. 18.

FIG. 14 illustrates an example in which the adhesive layer 32 is excessively removed in Step S31. FIG. 14 is a cross-sectional view illustrating the state of a semiconductor device according to Comparative Example 2 during manufacture. In Step S31, when the adhesive layer 32 is excessively removed, an outer circumferential position 32c-2 of an outer circumferential end 32b of an adhesive layer 32 is located inside a pointed portion 1e at the outer circumferential end of a wafer 1 (a portion represented by reference numeral 30), as illustrated in FIG. 14. In this case, when the laser beam 13 is radiated in order to peel the glass substrate 3 in Step S8, the laser beam 13 is radiated to the wafer 1 and the wafer 1 is damaged, which is not preferable.

As described above, according to Embodiment 3, before laser irradiation for peeling the glass substrate from the adhesive layer is performed, a portion of the adhesive layer which covers the chamfered portion and side surface of the glass substrate is removed. Therefore, it is possible to obtain the same effect as that in Embodiment 1. In addition, after the rear surface of the wafer is processed, the end of the adhesive layer is partially removed. Therefore, it is possible to ensure the mechanical strength of the wafer when the rear surface of the wafer is processed. In addition, it is possible to reduce the adhesive area between the adhesive layer and the glass substrate when the glass substrate is peeled from the adhesive layer. Therefore, it is possible to prevent the chipping or breaking of the wafer and to easily peel the glass substrate from the adhesive layer.

Figure 15:
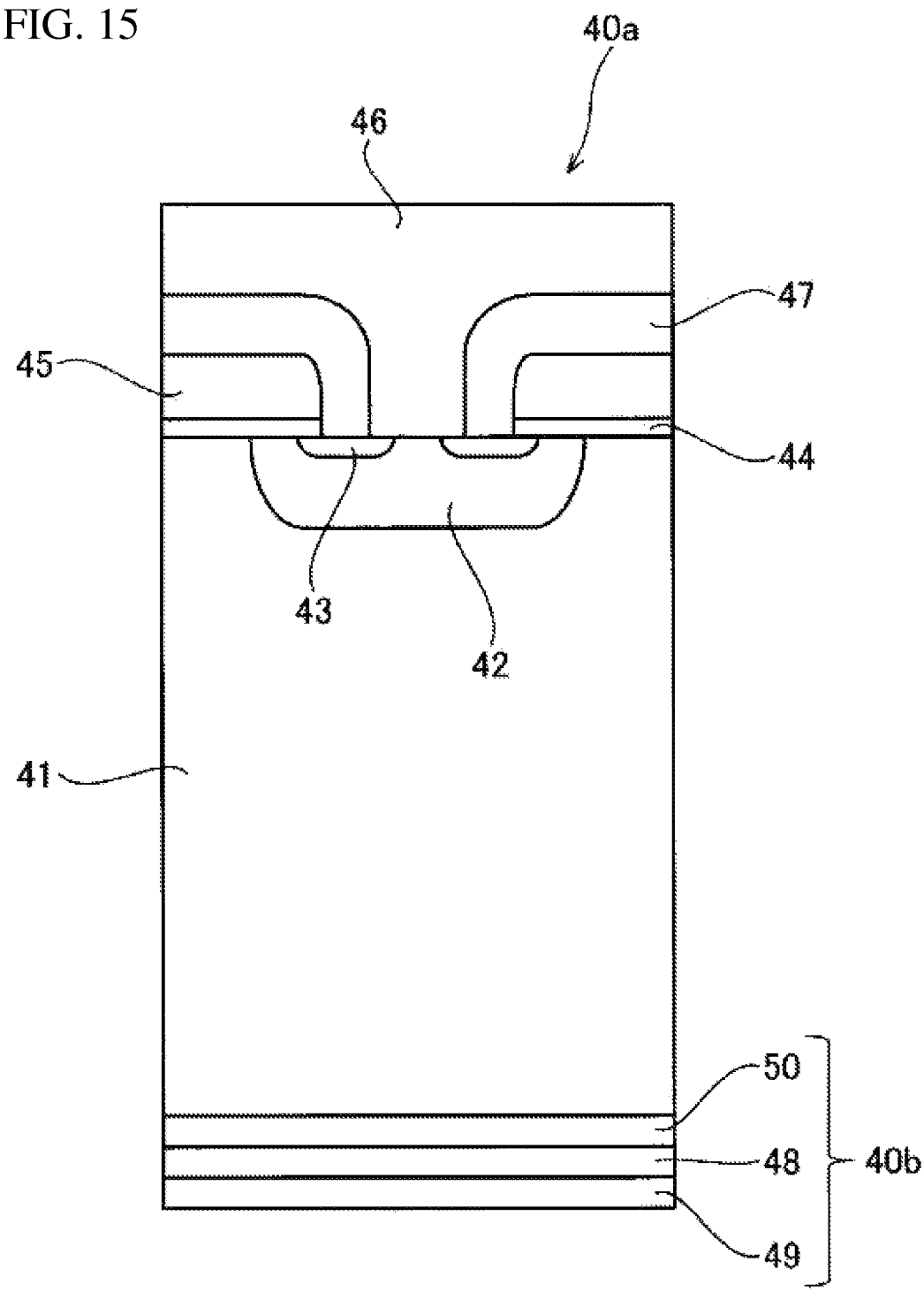
FIG. 15 is a cross-sectional view illustrating an example of a semiconductor device manufactured by the semiconductor device manufacturing method according to the invention.
Figure 17:
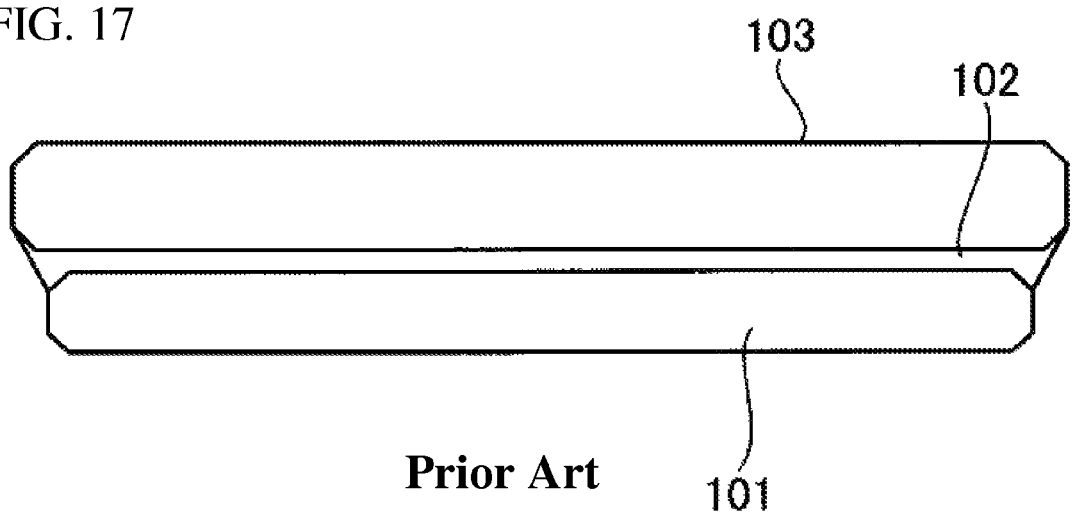
FIG. 17 is a cross-sectional view illustrating the state of a semiconductor device according to the related art during manufacture.
Figure 18:
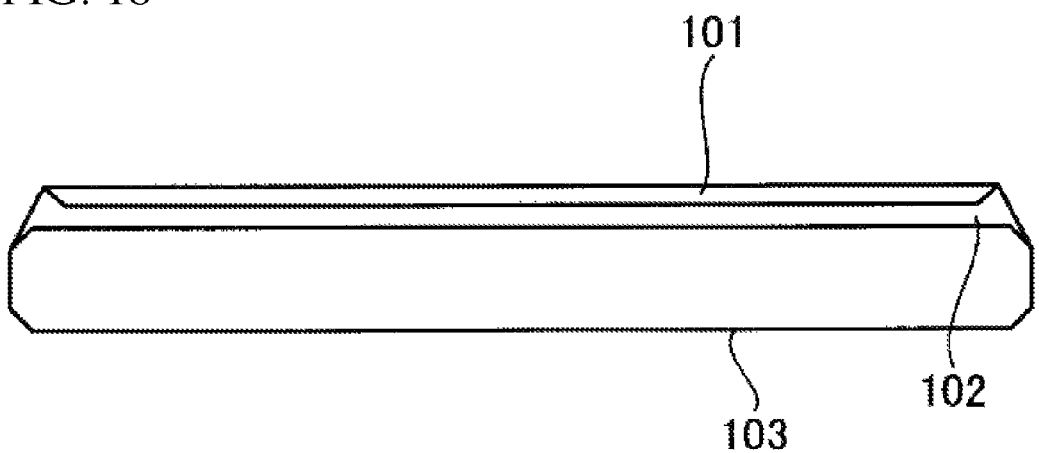
FIG. 18 is a cross-sectional view illustrating the state of the semiconductor device according to the related art during manufacture.
Figure 19:
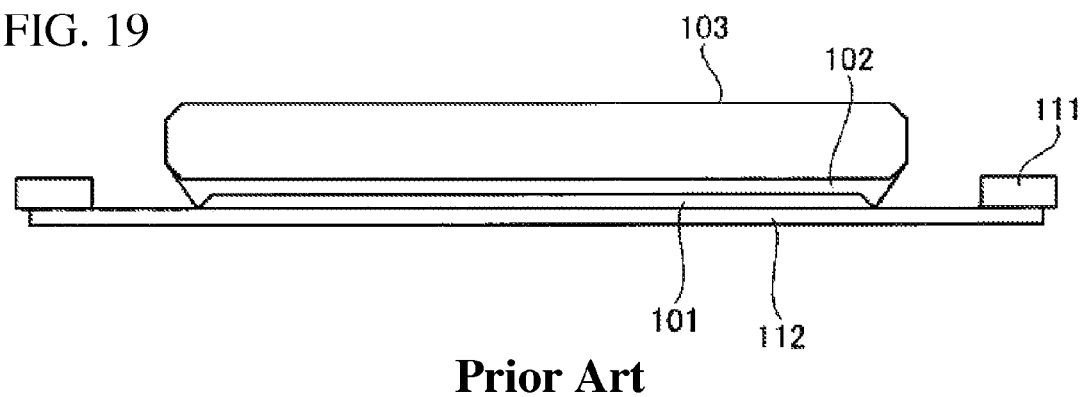
FIG. 19 is a cross-sectional view illustrating the state of the semiconductor device according to the related art during manufacture.
Figure 20:
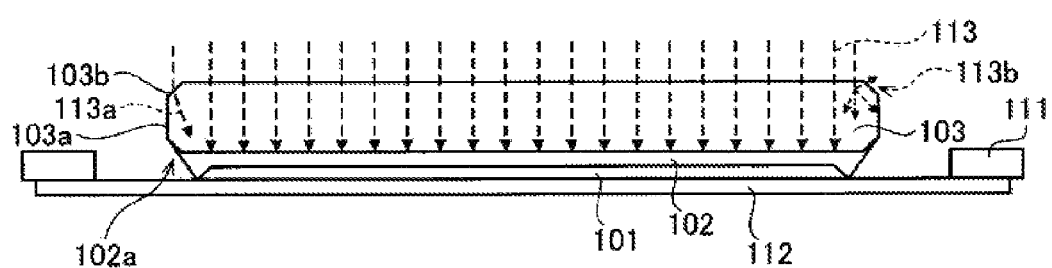
FIG. 20 is a cross-sectional view illustrating the state of the semiconductor device according to the related art during manufacture.
Figure 21:
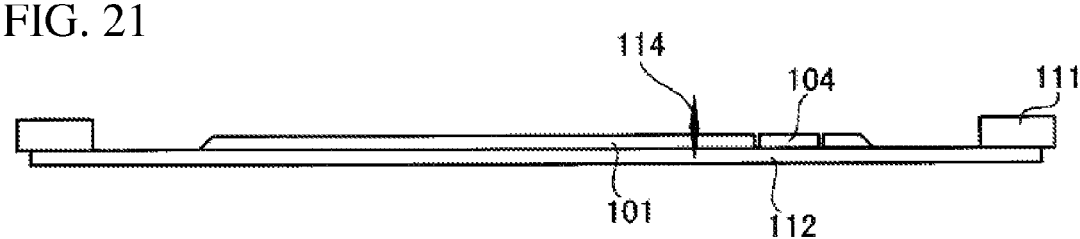
FIG. 21 is a cross-sectional view illustrating the state of the semiconductor device according to the related art during manufacture.

Next, the structure of a field stop insulated gate bipolar transistor (FS IGBT) will be described as an example of the structure of the semiconductor device manufactured according to each embodiment. FIG. 15 is a cross-sectional view illustrating an example of a semiconductor device manufactured by the semiconductor device manufacturing method according to the invention. As illustrated in FIG. 15, the semiconductor device manufactured by the semiconductor device manufacturing method according to the invention includes a front surface element structure 40a that is formed on the front surface side of an n⁻ semiconductor substrate (chip) 41 which is the wafer 1 in Step S1 and a rear surface element structure 40b that is formed on the rear surface side of the n⁻ semiconductor substrate 41 in Step S6.

Specifically, a p base region 42 is selectively provided in a surface layer of the front surface of the n⁻ semiconductor substrate 41 which will be an n⁻ drift region. An n⁺ emitter region 43 is selectively provided in the p base region 42. A gate electrode 45 is provided over the surface of a portion of the p base region 42, which is interposed between an n⁻ drift region and the n⁺ emitter region 43, with a gate insulating film 44 interposed therebetween. An emitter electrode 46 contacts with the p base region 42 and the n⁺ emitter region 43 and is electrically insulated from the gate electrode 45 by an interlayer insulating film 47.

A p collector layer 48 is provided on the rear surface of the n⁻ semiconductor substrate 41. A collector electrode 49 contacts with the p collector layer 48. An n field stop layer 50 that prevents a depletion layer, which is spread from a pn junction between the p base region 42 and the n⁻ drift region when the semiconductor device is turned off, from reaching the p collector layer 48, is provided between the n⁻ drift region and the p collector layer 48. That is, the front surface element structure 40a includes the emitter electrode 46 and a MOS gate (metal-oxide-semiconductor insulated gate) structure including the p base region 42, the n⁺ emitter region 43, the gate insulating film 44, and the gate electrode 45. The rear surface element structure 40b includes the p collector layer 48, the n field stop layer 50, and the collector electrode 49.

The invention is not limited to the above-described embodiments and various modifications and changes of the invention can be made without departing from the scope and spirit of the invention. For example, in the above-described embodiments, the glass substrate is given as an example. However, supporting substrates made of other materials may be used as long as they can improve the mechanical strength of the wafer 1 and transmit laser beams. In addition, the FS IGBT is given as an example of the semiconductor device manufactured by the semiconductor device manufacturing method according to each embodiment. However, the invention is not limited thereto. The invention can also be applied to semiconductor devices with different structures. For example, the invention can be applied to an IGBT, a reverse blocking (RB) IGBT, an insulated gate field effect transistor (MOSFET), a diode, and a Schottky diode using a silicon wafer or a SiC wafer. In addition, in the invention, an n type and a p type may be reversed. In this case, the same effect as described above is obtained.

INDUSTRIAL APPLICABILITY

As described above, the semiconductor device manufacturing method according to the invention is useful for a power semiconductor device which is used in, for example, an ultrathin device such as an integrated circuit (IC) device for a memory card.

EXPLANATIONS OF LETTERS OR NUMERALS

1 WAFER
1a SIDE SURFACE OF WAFER
1b CHAMFERED PORTION OF WAFER
1c FRONT SURFACE OF WAFER
1d REAR SURFACE OF WAFER
1e POINTED PORTION AT OUTER CIRCUMFERENTIAL END OF WAFER
2, 22, 32 ADHESIVE, ADHESIVE LAYER
2a OUTER CIRCUMFERENTIAL END OF ADHESIVE
2b, 22b-1 to 22b-3, 32b OUTER CIRCUMFERENTIAL END OF ADHESIVE LAYER
3 GLASS SUBSTRATE
3a SIDE SURFACE OF GLASS SUBSTRATE
3b CHAMFERED PORTION OF GLASS SUBSTRATE
3c FIRST SURFACE OF GLASS SUBSTRATE
3d SECOND SURFACE OF GLASS SUBSTRATE
11 DICING FRAME
12 DICING TAPE
13 LASER BEAM
40a FRONT SURFACE ELEMENT STRUCTURE
40b REAR SURFACE ELEMENT STRUCTURE
41 n⁻ SEMICONDUCTOR SUBSTRATE
42 p BASE REGION
43 n⁺ EMITTER REGION
44 GATE INSULATING FILM
45 GATE ELECTRODE
46 EMITTER ELECTRODE
47 INTERLAYER INSULATING FILM
48 p COLLECTOR LAYER
49 COLLECTOR ELECTRODE
50 n FIELD STOP LAYER

What is claimed is:

1. A method for manufacturing a semiconductor device, comprising:
   an adhesive layer forming step of forming an adhesive layer formed of a polyimide-based liquid adhesive or an acryl-based liquid adhesive on a first main surface of a semiconductor wafer such that an outer circumferential portion protrudes outwardly more than a central portion;
   a bonding step of bonding a supporting substrate wherein a corner between a side surface and a surface facing the first main surface of the semiconductor wafer is chamfered to form a chamfered portion, to the first main surface of the semiconductor wafer, with the adhesive layer interposed therebetween, such that a side surface of the semiconductor wafer and the chamfered portion of the supporting substrate are covered by the adhesive layer; and
   a removal step of removing a portion of the adhesive layer which covers the chamfered portion of the supporting substrate and an outer portion of the chamfered portion of the supporting substrate after the bonding step,
   wherein in the removal step, the adhesive layer is remained on the surface of the supporting substrate facing the first main surface of the semiconductor wafer, and is removed from the chamfered portion and the side surface of the supporting substrate.

2. The method for manufacturing a semiconductor device according to claim 1, wherein a corner between the first main surface and the side surface of the semiconductor wafer is chamfered to form a chamfered portion of the semiconductor wafer,
   the method further comprising a thinning step of grinding the semiconductor wafer from a second main surface of the semiconductor wafer, in a condition bonded to the supporting substrate, to the chamfered portion of the semiconductor wafer to reduce a thickness of the semiconductor wafer, wherein in the removal step, the adhesive layer is removed such that a portion of the adhesive layer which covers the first main surface and the chamfered portion of the semiconductor wafer thinned in the thinning step remains.

3. The method for manufacturing a semiconductor device according to claim 2, further comprising:
an element structure forming step of forming an element structure on the second main surface of the semiconductor wafer thinned in the thinning step before the removal step,
wherein in the removal step, an adhesive area between the supporting substrate and the adhesive layer is reduced such that a position of an outer circumference of the adhesive layer is located outside a position of an outer circumference of the semiconductor wafer.

4. The method for manufacturing a semiconductor device according to claim 1, wherein the semiconductor wafer includes the first main surface, the side surface, and a chamfered portion formed by chamfering a corner between the first main surface and the side surface; and
in the bonding step, the adhesive layer covers the first main surface, the side surface, and the chamfered portion.

5. The method for manufacturing a semiconductor device according to claim 4, wherein in the adhesive layer forming step, the polyimide-based liquid adhesive or the acryl-based liquid adhesive is placed on the semiconductor wafer, and the semiconductor wafer is rotated to spread the polyimide-based liquid adhesive or the acryl-based liquid adhesive by a centrifugal force to form the adhesive layer protruding outwardly at the outer circumferential portion.

6. The method for manufacturing a semiconductor device according to claim 5, wherein in the bonding step, the supporting substrate is placed on the first main surface of the semiconductor wafer on which the adhesive layer is formed, and the supporting substrate is pressed in a direction pressing the adhesive layer to the semiconductor wafer, while being heated in a vacuum atmosphere, such that the adhesive layer covers the side surface and the chamfered portion of the semiconductor wafer.

7. The method for manufacturing a semiconductor device according to claim 1, wherein the adhesive layer forming step includes applying on an entire surface of the first main surface the adhesive layer by a coater, and rotating the semiconductor wafer to spread the adhesive on the first main surface by the centrifugal force.

* * * * *